(12) United States Patent
Cook et al.

(10) Patent No.: US 10,444,432 B2
(45) Date of Patent: Oct. 15, 2019

(54) GALVANIC SIGNAL PATH ISOLATION IN AN ENCAPSULATED PACKAGE USING A PHOTONIC STRUCTURE

(71) Applicant: Texas Instruments Incorporated, Dallas, TX (US)

(72) Inventors: Benjamin Stassen Cook, Addison, TX (US); Daniel Lee Revier, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/799,740

(22) Filed: Oct. 31, 2017

(65) Prior Publication Data

US 2019/0131682 A1    May 2, 2019

(51) Int. Cl.
*G02B 6/122* (2006.01)
*H01P 3/10* (2006.01)
(Continued)

(52) U.S. Cl.
CPC ....... *G02B 6/1225* (2013.01); *G02B 6/12004* (2013.01); *H01L 21/56* (2013.01); *H01L 23/3121* (2013.01); *H01L 23/49513* (2013.01); *H01L 23/49537* (2013.01); *H01L 23/49548* (2013.01); *H01L 23/49575* (2013.01); *H01L 24/48* (2013.01); *H01P 1/2005* (2013.01); *H01P 3/10* (2013.01); *H01P 3/16* (2013.01); *G02B 2006/12123* (2013.01); *H01L 2224/32245* (2013.01); *H01L 2224/48091* (2013.01); *H01L 2224/48137* (2013.01); *H01L 2224/48245* (2013.01); *H01L 2224/48247* (2013.01); *H01L 2224/4903* (2013.01);
(Continued)

(58) Field of Classification Search
CPC .............................. G02B 6/1225; H01L 21/56
See application file for complete search history.

(56) References Cited

U.S. PATENT DOCUMENTS 3,868,759 A   3/1975 Hartleroad et al.
3,868,764 A   3/1975 Hartleroad et al.
(Continued)

FOREIGN PATENT DOCUMENTS

SU    1780469 A1   10/1995
WO    2006101577 A2   9/2006
WO    2017111892 A1   6/2017

OTHER PUBLICATIONS

"Phonon", Wikipedia, available at https://en.wikipedia.org/wiki/Phonon on Aug. 2, 2017, pp. 1-9.
(Continued)

*Primary Examiner* — Daniel Petkovsek
(74) *Attorney, Agent, or Firm* — Michael A. Davis, Jr.; Charles A. Brill; Frank D. Cimino

(57) ABSTRACT

An encapsulated package is provided that includes a pair integrated circuit (IC) die. A radio frequency (RF) circuit on one of the IC die is operable to transmit an RF signal having a selected frequency. An RF circuit on the other IC die is operable to receive the RF signal Encapsulation material encapsulates the IC die. A photonic waveguide couples between the RF transmitter and RF receiver to form galvanic path isolation between the two IC die. The photonic waveguide is formed by a photonic structure within the encapsulation material.

18 Claims, 11 Drawing Sheets

(51) Int. Cl.
  *H01L 23/31* (2006.01)
  *H01L 23/495* (2006.01)
  *H01L 23/00* (2006.01)
  *H01L 21/56* (2006.01)
  *G02B 6/12* (2006.01)
  *H01P 1/20* (2006.01)
  *H01P 3/16* (2006.01)
  *H01P 3/123* (2006.01)

(52) U.S. Cl.
  CPC .............. *H01L 2224/73265* (2013.01); *H01L 2924/00014* (2013.01); *H01P 3/123* (2013.01)

(56) References Cited

U.S. PATENT DOCUMENTS

| | | | |
|---|---|---|---|
| 4,974,590 A | 12/1990 | Saito | |
| 4,999,587 A | 3/1991 | Evans | |
| 5,355,577 A | 10/1994 | Cohn | |
| 5,500,912 A * | 3/1996 | Alonas | G02B 6/4295 257/E31.108 |
| 5,528,074 A * | 6/1996 | Goto | H01L 23/66 257/664 |
| 5,834,320 A | 11/1998 | Huddleston et al. | |
| 6,664,615 B1 | 12/2003 | Bayan et al. | |
| 6,967,347 B2 * | 11/2005 | Estes | B82Y 10/00 257/25 |
| 6,979,105 B2 | 12/2005 | Leysath | |
| 7,228,016 B2 * | 6/2007 | Beausoleil | B82Y 20/00 385/12 |
| 7,305,161 B2 * | 12/2007 | Zhou | B82Y 20/00 385/147 |
| 7,733,198 B1 | 6/2010 | Olsson et al. | |
| 8,031,012 B2 * | 10/2011 | Hasegawa | B82Y 20/00 250/227.12 |
| 8,054,145 B2 | 11/2011 | Mohammadi et al. | |
| 8,094,023 B1 | 1/2012 | El-Kady et al. | |
| 8,138,868 B2 | 3/2012 | Arnold | |
| 8,143,637 B2 * | 3/2012 | Kanatake | G02B 6/42 257/100 |
| 8,587,182 B2 | 11/2013 | Reiche | |
| 9,018,074 B2 | 4/2015 | Zhang et al. | |
| 9,070,703 B2 | 6/2015 | Haroun et al. | |
| 9,123,737 B2 * | 9/2015 | Haroun | H01L 23/66 |
| 9,306,263 B2 | 4/2016 | Haroun et al. | |
| 9,343,426 B1 | 5/2016 | Parvarandeh | |
| 9,373,878 B2 | 6/2016 | Schuppener et al. | |
| 9,450,563 B2 | 8/2016 | Gorisse et al. | |
| 9,583,811 B2 | 2/2017 | Seler et al. | |
| 9,647,329 B2 | 5/2017 | Herbsommer et al. | |
| 9,651,718 B2 | 5/2017 | Chen et al. | |
| 10,062,583 B2 | 8/2018 | Costa et al. | |
| 10,139,564 B1 * | 11/2018 | Homeijer | G02B 6/1225 |
| 2005/0224956 A1 | 10/2005 | Kao et al. | |
| 2006/0038168 A1 | 2/2006 | Estes et al. | |
| 2006/0054780 A1 | 3/2006 | Garrood et al. | |
| 2007/0108545 A1 | 5/2007 | Chua et al. | |
| 2008/0112665 A1 | 5/2008 | Beausoleil et al. | |
| 2008/0218299 A1 | 9/2008 | Arnold | |
| 2009/0288852 A1 | 11/2009 | Hirokawa et al. | |
| 2010/0019247 A1 | 1/2010 | Joichi et al. | |
| 2011/0001233 A1 | 1/2011 | Iwase et al. | |
| 2011/0089815 A1 | 4/2011 | Yeh et al. | |
| 2011/0103632 A1 | 5/2011 | Leclair et al. | |
| 2011/0221057 A1 | 9/2011 | Lin et al. | |
| 2012/0043628 A1 | 2/2012 | Martin et al. | |
| 2012/0098611 A1 | 4/2012 | Sinha et al. | |
| 2012/0154168 A1 | 6/2012 | Duncan et al. | |
| 2013/0038174 A1 | 2/2013 | Kim et al. | |
| 2013/0228796 A1 | 9/2013 | Mieczkowski | |
| 2014/0287703 A1 | 9/2014 | Herbsommer et al. | |
| 2015/0237423 A1 | 8/2015 | Bahr et al. | |
| 2015/0295305 A1 * | 10/2015 | Herbsommer | H01Q 19/108 343/873 |
| 2015/0325501 A1 | 11/2015 | Sutton et al. | |
| 2016/0028367 A1 | 1/2016 | Shealy | |
| 2016/0276311 A1 | 9/2016 | Meyer et al. | |
| 2016/0327977 A1 | 11/2016 | Tang et al. | |
| 2017/0084519 A1 | 3/2017 | Speight et al. | |
| 2017/0108655 A1 | 4/2017 | Zarbock et al. | |
| 2017/0186793 A1 | 6/2017 | Ockenfuss | |
| 2017/0253476 A1 | 9/2017 | Shibuya et al. | |
| 2017/0276870 A1 | 9/2017 | Snyman | |
| 2017/0288123 A1 | 10/2017 | Hatano et al. | |
| 2017/0292884 A1 | 10/2017 | Ching, Jr. et al. | |

OTHER PUBLICATIONS

Yan Pennec and Bahram Djafari-Rouhani, "Fundamental Properties of Phononic Crystal", Chapter 2 in "Phononic Crystals", 2016, pp. 23-50.

Daniel Frederic Sievenpiper, "High-Impedance Electromagnetic Surfaces", 1999, University of California, pp. 1-162.

"7 Families of Additive Manufacturing", According to ASTM F2792 Standards, Hybrid Manufacturing Technologies, pp. 1-2.

"Standard Terminology for Additive Manufacturing Technologies", ASTM International, F2792-12a, Sep. 9, 2013, pp. 1-3.

Nagi Elabbasi, "Modeling Phononic Band Gap Materials and Structures", Comsol Blog, Feb. 10, 2016, pp. 1-7.

Dr. Qin Hu, "Multiphoton Lithograpy Based 3D Micro/Nano Printing", EPSRC Centre for Innovative Manufacturing in Additive Manufacturing, pp. 1-30.

Benjamin Stassen Cook and Daniel Lee Revier, "Thermal Management in Integrated Circuit Using Phononic Bandgap Structure", U.S. Appl. No. 15/792,580, filed Oct. 24, 2017, pp. 1-33.

Benjamin Stassen Cook and Daniel Lee Revier, "Electromagnetic Interference Shield within Integrated Circuit Encapsulation Using Photonic Bandgap Structure", U.S. Appl. No. 15/799,757, filed Oct. 31, 2017, pp. 1-38.

Benjamin Stassen Cook and Daniel Lee Revier, "integrated Circuit with Dielectric Waveguide Connector Using Photonic Bandgap Structure", U.S. Appl. No. 15/800,042, filed Oct. 31, 2017, pp. 1-42.

Benjamin Stassen Cook and Daniel Lee Revier, "Spectrometry in Integrated Circuit Using a Photonic Bandgap Structure", U.S. Appl. No. 15/800,009, filed Oct. 31, 2017, pp. 1-41.

Daniel Lee Revier and Benjamin Stassen Cook, "Acoustic Management in Integrated Circuit Using Phononic Bandgap Structure", U.S. Appl. No. 15/792,591, filed Oct. 24, 2017, pp. 1-37.

Optical Sensor-On-Chip ICs Simplify Handheld Spectrometer Design, available at https://www.digikey.com/en/articles/techzone/2017/jun/optical-sensor-on-chip-ics-simplify-handheld-spectrometer-design, Digi-Key Electronics, Jun. 28, 2017, pp. 1-6.

Hideo Kosaka et al, "Self-Collimating Phenomena in Photonic Crystals", Applied Physics Letters, vol. 74, No. 9, Mar. 1, 1999, pp. 1212-1214.

International Search Report for PCT/US2018/049166 dated Dec. 13, 2018.

International Search Report for PCT/US2018/049135 dated Dec. 13, 2018.

International Search Report for PCT/US2018/058478 dated Feb. 14, 2019.

Mohammadi, et al. Complete phononic bandgaps and bandgap maps in two-dimensional silicon phononic crystal plates; Electronics Letters Aug. 2, 2017, vol. 43 No. 16. 2 pages.

International Search Report for PCT/US2018/058481 dated Feb. 7, 2019.

International Search Report for PCT/US2018/058487 dated Feb. 14, 2019.

International Search Report for PCT/US20181057358 dated Feb. 7, 2019.

International Search Report for PCT/US2018/057351 dated Feb. 7, 2019.

International Search Report for PCT/US2018/058494 dated Feb. 21, 2019.

* cited by examiner

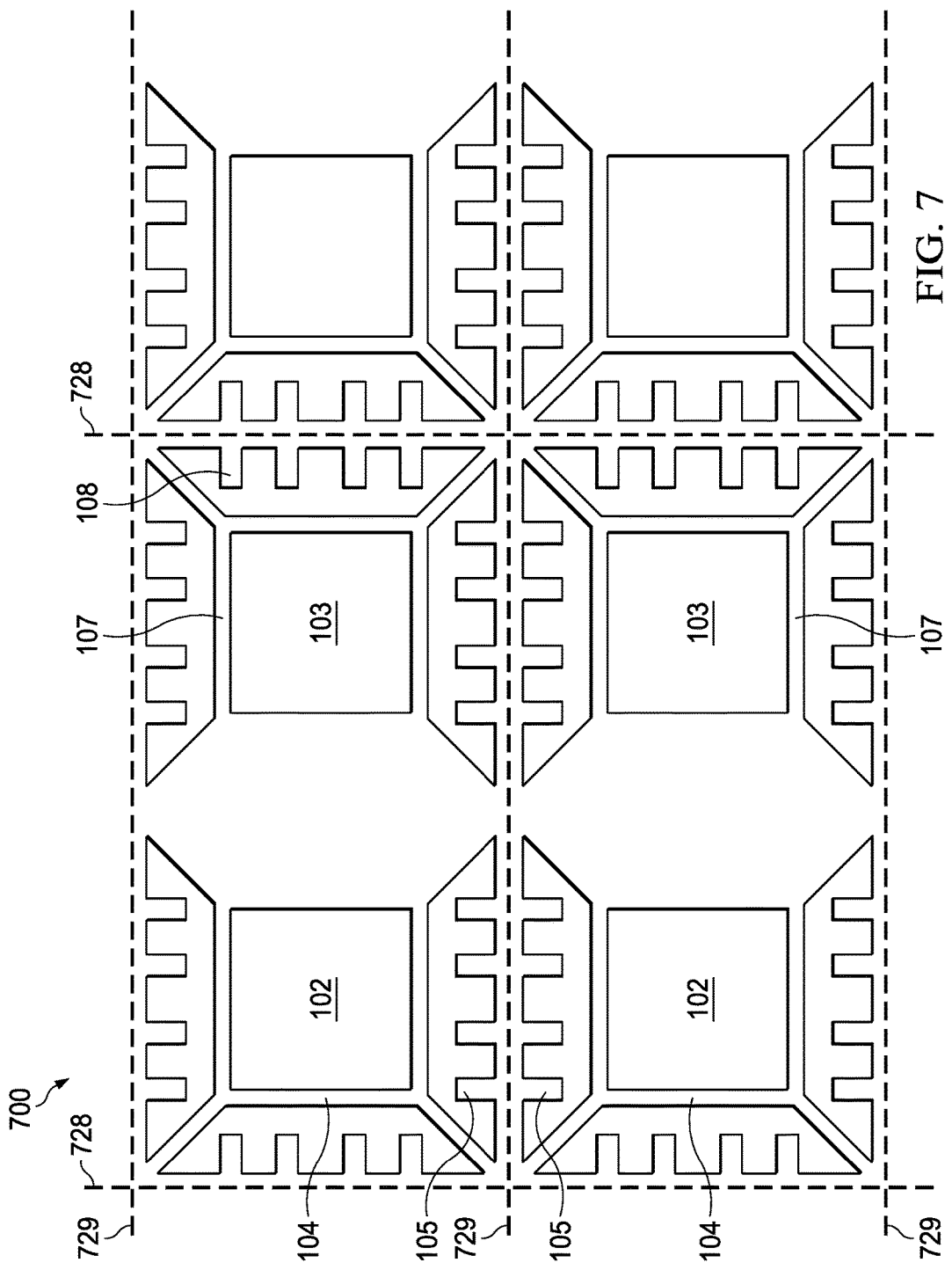

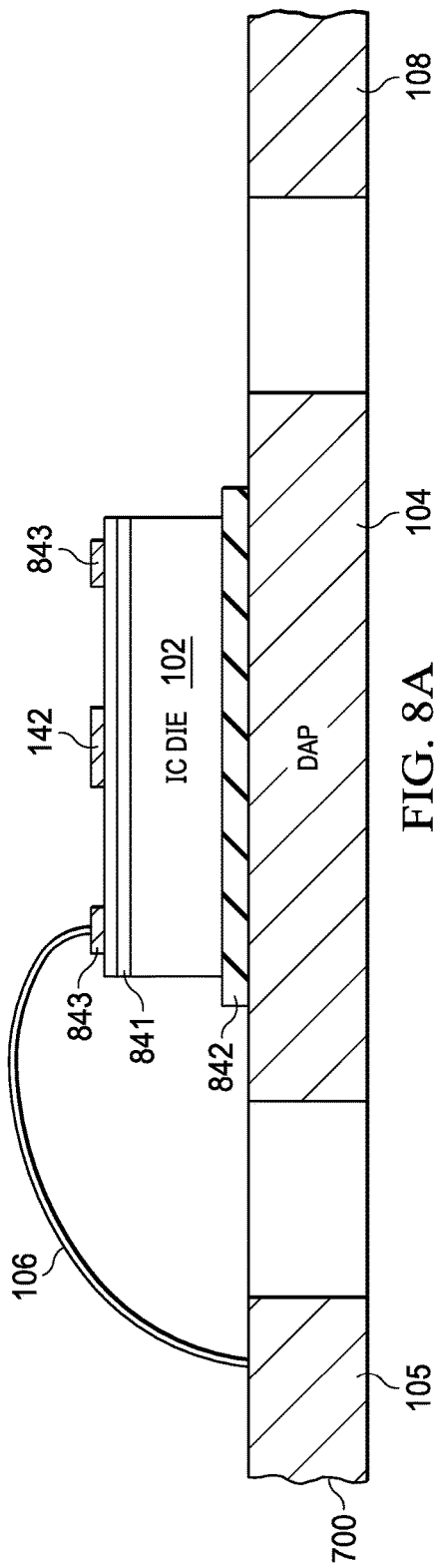
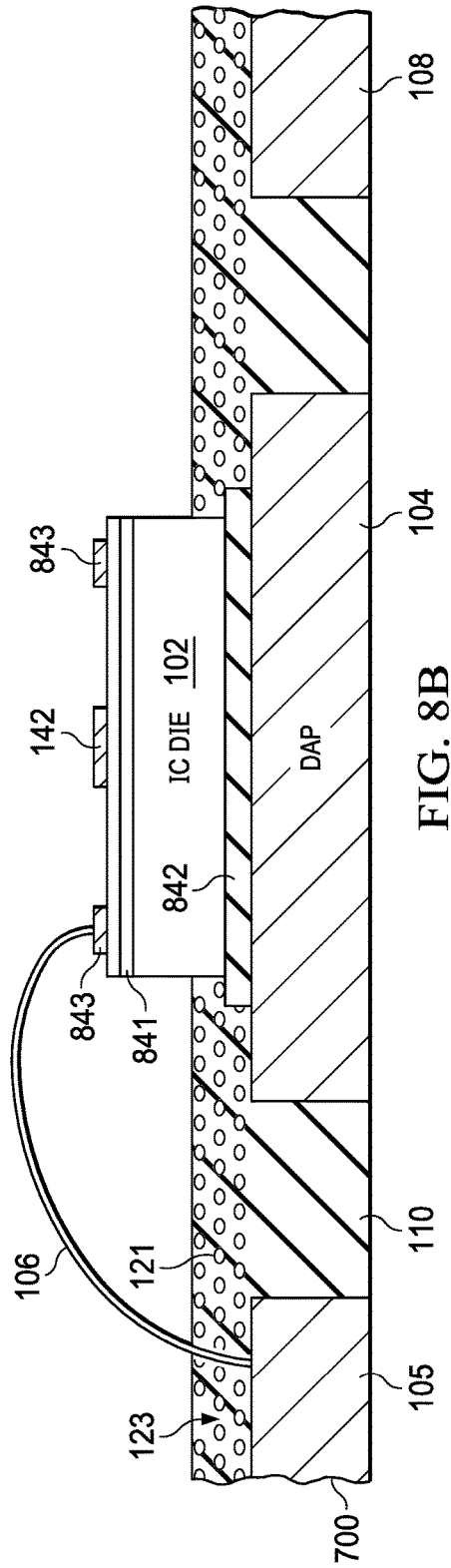

GALVANIC SIGNAL PATH ISOLATION IN AN ENCAPSULATED PACKAGE USING A PHOTONIC STRUCTURE

FIELD OF THE DISCLOSURE

This disclosure relates to an integrated circuit package that includes a photonic structure in the package encapsulation material.

BACKGROUND OF THE DISCLOSURE

Individual discrete components are typically fabricated on a silicon wafer before being cut into separate semiconductor die and assembled in a package. The package provides protection against impact and corrosion, holds the contact pins or leads which are used to connect from external circuits to the device, and dissipates heat produced in the device.

Wire bonds may be used to make electrical connections between an integrated circuit and the leads of the package with fine wires connected from the package leads and bonded to conductive pads on the semiconductor die. The leads external to the package may be soldered to a printed circuit board. Modern surface mount devices eliminate the need for drilled holes through circuit boards and have short metal leads or pads on the package that can be secured by reflow soldering.

Many devices are encapsulated with an epoxy plastic that provides adequate protection of the semiconductor devices and mechanical strength to support the leads and handling of the package. Some integrated circuits have no-lead packages such as quad-flat no-leads (QFN) and dual-flat no-leads (DFN) devices that physically and electrically couple integrated circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. Perimeter lands on the package provide electrical coupling to the printed circuit board.

A dielectric is an electrical insulator that can be polarized by an applied electric field. When a dielectric is placed in an electric field, electric charges do not flow through the material as they do in a conductor, but only slightly shift from their average equilibrium positions causing dielectric polarization. Because of dielectric polarization, positive charges are displaced toward the field and negative charges shift in the opposite direction. This creates an internal electric field which reduces the overall field within the dielectric itself. If a dielectric is composed of weakly bonded molecules, those molecules not only become polarized, but also reorient so that their symmetry axis aligns to the field. While the term "insulator" implies low electrical conduction, "dielectric" is typically used to describe materials with a high polarizability which is expressed by a number called the relative permittivity ($\varepsilon r$). The term insulator is generally used to indicate electrical obstruction while the term dielectric is used to indicate the energy storing capacity of the material by means of polarization.

Permittivity is a material property that expresses the force between two point charges in the material. Relative permittivity is the factor by which the electric field between the charges is decreased or increased relative to vacuum. Relative permittivity is also commonly known as dielectric constant.

BRIEF DESCRIPTION OF THE DRAWINGS

Particular embodiments in accordance with the disclosure will now be described, by way of example only, and with reference to the accompanying drawings:

FIG. 7 is a top view of an example leadframe;

FIGS. 8A-8C illustrate formation of a photonic bandgap structure using an additive manufacture process to encapsulate an IC;

Figure 1:
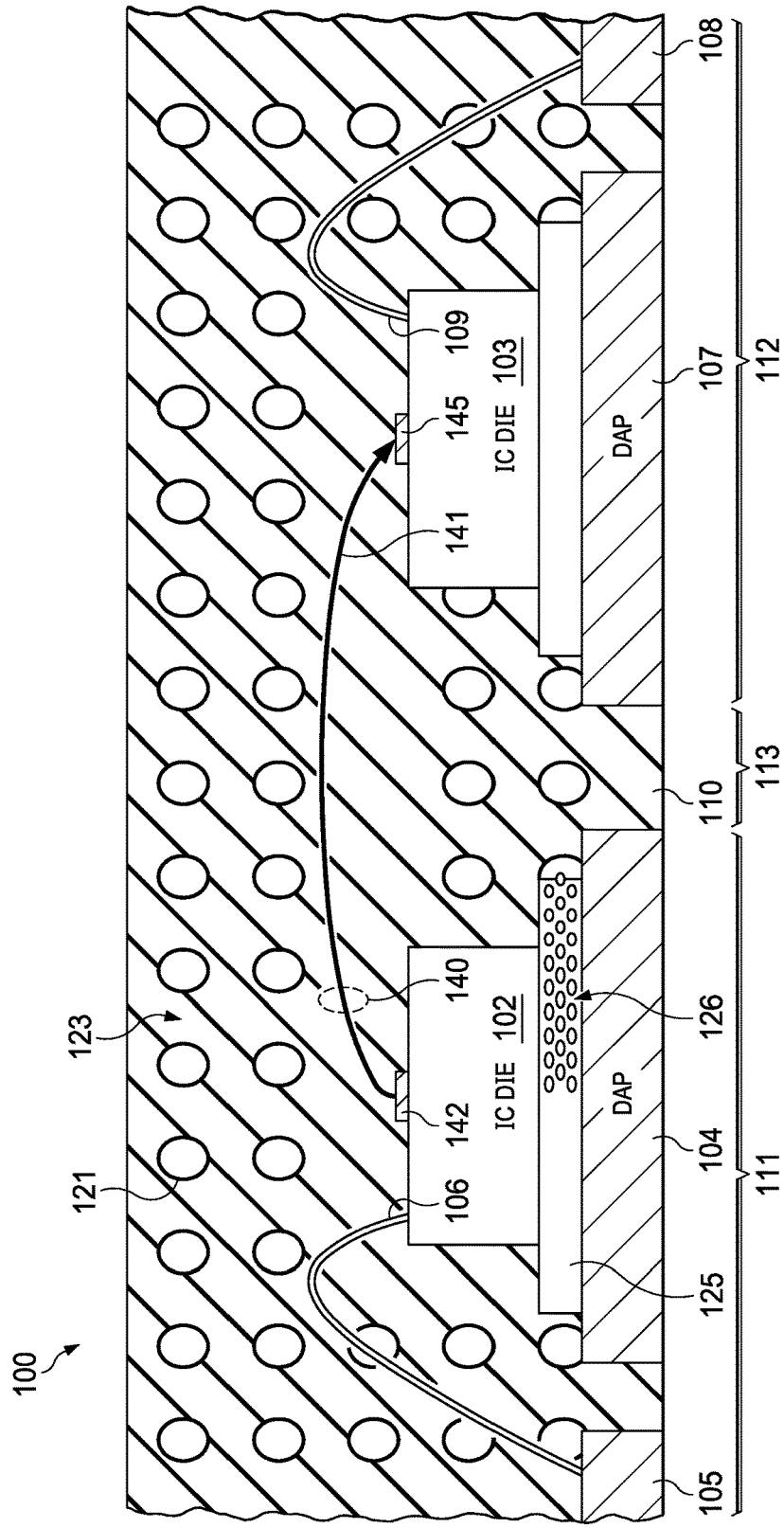
FIG. 1 is an example encapsulated package that includes a high voltage galvanic path isolation structure formed by a photonic bandgap structure.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

The epoxy encapsulant for semiconductor chips/packages has typically served the primary purpose of providing environmental and mechanical protection for the integrated circuit (IC). Previously, in order for an additional package function to be added, it must be added before or after the encapsulation step. Performing additional packaging steps may increase cost and limit functionality on the processes that can be performed. A method for encapsulating an IC will now be disclosed in which a structure to perform an additional package function may be created during the process of encapsulation.

As frequencies in electronic components and systems increase, the wavelength decreases in a corresponding manner. For example, many computer processors now operate in the gigahertz realm. As operating frequencies increase to sub-terahertz, the wavelengths become short enough that signal lines that exceed a short distance may act as an antenna and signal radiation may occur. For example, in a material with a low dielectric constant of 3, such as a printed circuit board, a 100 GHz signal will have a wavelength of approximately 1.7 mm. Thus, a signal line that is only 1.7 mm in length may act as a full wave antenna and radiate a significant percentage of the signal energy.

In physics, a photon represents an energy packet, or "quanta" of electromagnetic waves. A photon is massless, has no electric charge, and is a stable particle. In the momentum representation of the photon, a photon may be described by its wave vector which determines its wavelength and direction of propagation.

Additive manufacturing has enabled the deposition of patterned materials in a rapid and cost efficient manner. By utilizing additive manufacturing, control structures may be integrated directly into the encapsulation material of an IC. As will be disclosed herein, a waveguide to allow galvanic signal path isolation may be provided in the encapsulation of an IC package through the implementation of multi-material photonic bandgap (PBG) structures within the encapsulation. Galvanic path isolation allows signals to be transferred between systems that are operating on different ground references and/or different voltage levels.

Known galvanic isolation devices often use optical devices to provide isolation; however, such optical devices may be expensive.

FIG. 1 is an example encapsulated integrated circuit (IC) package 100 that includes a waveguide 140 formed by a photonic bandgap structure within the encapsulant material 110. Waveguide region 140 will be referred to herein as a "photonic waveguide." A signal 141 may be launched into photonic waveguide 140 by a transmitter structure 142 that is formed on IC die 102 using known or later developed techniques. Photonic waveguide 140 may then conduct signal 141 to a receiver structure 145 that is formed on IC die 103 using known or later developed techniques with minimal radiation loss. In this manner, galvanic isolation between two different systems operating on different ground references and/or voltage levels may be provided.

The general analysis and configuration of photonic waveguide 140 may be done in a similar manner as a dielectric waveguide. For example, photonic waveguide 140 may have a rectangular cross-section. The long side of this cross-section may be twice as long as its short side, for example. This is useful for carrying electromagnetic waves that are horizontally or vertically polarized. For sub-terahertz signals, such as in the range of 130-150 gigahertz, a photonic waveguide dimension of approximately 0.5 mm×1.0 mm works well.

Waves in open space propagate in all directions, as spherical waves. In this way they lose their power proportionally to the square of the distance; that is, at a distance R from the source, the power is the source power divided by R2. Photonic waveguide 140 confines the wave to propagation in one dimension, so that under ideal conditions the wave loses no power while propagating.

IC die 102 may be attached to a die attach pad (DAP) 104 of a leadframe that includes a set of contacts 105. DAP 104 may also be referred to as a "thermal pad." IC die 102 may also be referred to as a "chip." IC die 102 may be fabricated using known or later developed semiconductor processing techniques. IC die 102 may include an epitaxial (epi) layer on the top surface in which are formed various semiconductor transistor devices and interconnects. One or more conductive layers may be formed on the epi layer and patterned into interconnect traces and bond pads. A set of bond wires 106 may be attached to contacts 105 and bond pads located on the surface of IC die 106 using known or later developed wire bonding techniques.

Similarly, IC die 103 may be attached to a die attach pad 107 of the leadframe that includes a set of contacts 108. IC die 103 may be fabricated using known or later developed semiconductor processing techniques. IC die 103 may include an epitaxial (epi) layer on the top surface in which are formed various semiconductor transistor devices and interconnects. One or more conductive layers may be formed on the epi layer and patterned into interconnect traces and bond pads. A set of bond wires 109 may be attached to contacts 108 and bond pads located on the surface of IC die 103 using known or later developed wire bonding techniques.

Encapsulated package 100 forms two galvanic path isolated regions 111, 112. In region 111, DAP 104 and IC die 102 are galvanically isolated from DAP 107 and IC die 103 in region 112. Region 111 may be coupled to another device or system that is operating on a different ground reference and/or at a different voltage reference than region 112. In this manner, a signal from a device or system may be coupled to contacts 105 and provided thereby to transmitter circuitry on IC die 102, converted to an RF signal, and launched into photonic waveguide 140. The photonic signal may then be received by receiving circuitry on IC die 103, converted back to an electrical signal, and provided to another device or system via contacts 108.

Components in region 111 are separated from components in region 112 by a separation distance that forms voltage barrier region 113. The voltage breakdown strength of the encapsulation material in this region and the separation distance must be sufficient to prevent voltage breakdown between region 111 and region 112. The PBG structure formed by nodes 121 and lattice material 123 may provide more voltage protection than a single dielectric material since two or more different types of material may be used to form the nodes 121 and the lattice 123. Voltage isolation of 10 kvolts or more may be provided in this manner by appropriate selection of encapsulation materials 110, 121, 123 and physical separation distance between DAP 104 and DAP 107 and/or IC 102 and IC 103. A required separation distance for a target voltage breakdown strength with a given selection of encapsulation material may be referred to herein as a "voltage breakdown distance."

In this example, encapsulated package 100 is a dual-flat no-leads (DFN) package; however, in other embodiments various known or later developed packaging configurations, such as DFN, MLF, SON, flip chips, dual inline packages (DIP), etc, may be fabricated using the techniques disclosed herein to form an encapsulated package with a photonic bandgap structure included within the encapsulant material.

In this example, a solid encapsulant material 110 surrounds and encapsulates IC die 102 and IC die 103. A portion of the encapsulation material may include a matrix of interstitial nodes such as indicated at 121 that may be filled with a material that is different from encapsulation material 110. In this example, nodes 121 are arranged in a three dimensional array of spherical spaces that are in turn separated by a lattice of encapsulation material 123. Encapsulation material 123 may be the same or different as solid encapsulation material 110. The structure formed by the matrix of nodes 121 and lattice 123 will be referred to herein as a "photonic bandgap structure." The photonic bandgap (PBG) structure formed by periodic nodes 121 may effectively guide electromagnetic signal 141 through photonic waveguide 140.

Solid encapsulant material 110 is typically an epoxy based material that provides mechanical protection and seals IC die 102 from environmental gases and liquids.

As mentioned above, lattice 123 may be formed from the same material as solid encapsulation material 110, or it may be formed using a different material by using an additive manufacturing process. The array of nodes 121 may be formed with one or more different materials. For example, some of the nodes, such as nodes 121, may be filled with a first material and some of the nodes 121 may be filled with different types of material. There may be a number (N) of different materials that are used to fill N different sets of nodes within encapsulation material 123. Node material may be a polymer or other material that has different intrinsic material properties from the lattice material 123. For example, the node material may have various different intrinsic material properties from the lattice material, such as permittivity, permeability, conductivity, etc.

For example, certain nodes 121 may be filled with a high dielectric material, while other nodes 121 are filled with a low dielectric material. In some embodiments, node material 121 may be air, some other gas, or even a vacuum.

In the example of FIG. 1, lattice 123 forms a square three dimensional (3D) array of spherical nodes. In other embodiments, a differently shaped lattice may be formed to produce other shapes of arrays and nodes 121, such as: triangular, rectilinear, hexagonal, round nodes, elongated nodes, tubes, etc.

In some embodiments, die attachment 125 may be a thin layer of adhesive material. In other embodiments, die attachment 125 may include a portion 126 that is also a photonic bandgap structure.

A photonic crystal is an artificially manufactured structure, or material, with periodic constitutive or geometric properties that are designed to influence the characteristics of electromagnetic wave propagation. When engineering these crystals, it is possible to isolate these waves within a certain frequency range. Conversely it may be more helpful to consider these waves as particles and rely on the wave-particle duality throughout the explanation. For this reason, reference to "propagation" herein may refer to either the wave or particle movement through the substrate. Propagation within this selected frequency range, referred to as the band gap, is attenuated by a mechanism of interferences within the periodic system. Such behavior is similar to that of a more widely known nanostructure that is used in semiconductor applications, a photonic crystal. The general properties and characteristics of phononic and photonic structures are known, for example, see: "Fundamental Properties of Phononic Crystal," Yan Pennec and Bahram Djarari-Rouhani, Chapter 2 of "Phononic Crystals, Fundamentals and Applications" 2015, which is incorporated by reference herein.

Photonic crystals may be formed by a periodic repetition of inclusions in a matrix. The dielectric properties, shape, and arrangement of the scatterers may strongly modify the propagation of the electromagnetic waves in the structure. The photonic band structure and dispersion curves can then be tailored with appropriate choices of materials, crystal lattices, and topology of inclusions.

Similarly to any periodic structure, the propagation of electromagnetic waves in a photonic crystal is governed by the Bloch or Floquet theorem from which one can derive the band structure in the corresponding Brillouin zone. The periodicity of the structures, that defines the Brillouin zone, may be in one (1D), two (2D), or three dimensions (3D).

The general mechanism for the opening of a band gap is based on the destructive interference of the scattered waves by the inclusions. This necessitates a high contrast between the properties of the materials. In periodic structures, this is called the Bragg mechanism and the first band gap generally occurs at a frequency which is about a fraction of c/a, where "c" is a typical velocity of light, and "a" is the period of the structure.

Photonic bandgap structures may be designed and modeled using simulation software available from various vendors. For example, physics-based systems may be modeled and simulated using COMSOL Multiphysics® simulation software from COMSOL®. "Multiphysics" and "COMSOL" are registered trademarks of COMSOL AB. HFSS (High Frequency Structure Simulator) is available from Ansys. CST (Computer Simulation Technology) offers several simulation packages.

Various configurations of dielectric waveguides (DWG) and signal launching techniques are described in U.S. Pat. No. 9,306,263, entitled "Interface Between an Integrated Circuit and a Dielectric Waveguide Using a Dipole Antenna and Reflector" and is incorporated by reference herein.

Figure 2A:
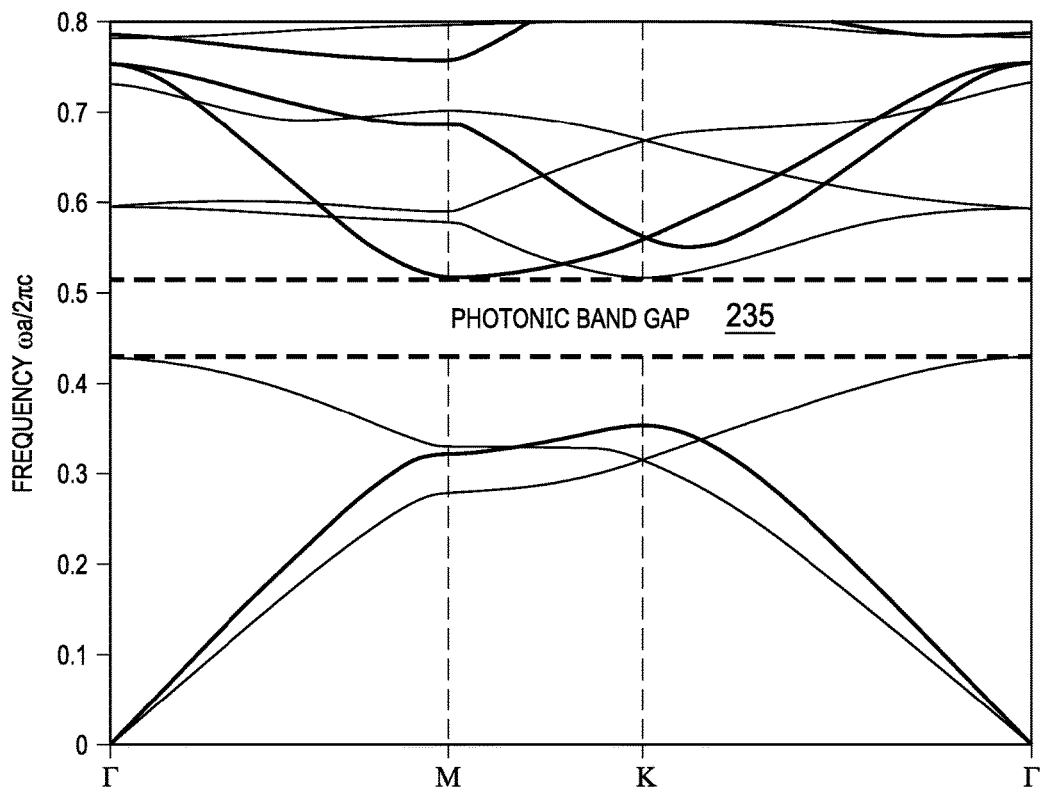
FIGS. 2A-2C is a frequency dispersion plot illustrating a band gap in a photonic bandgap structure having a hexagonal lattice.
Figure 2B:
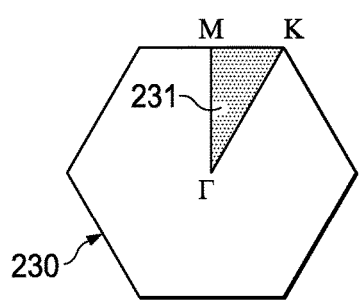
Figure 2C:
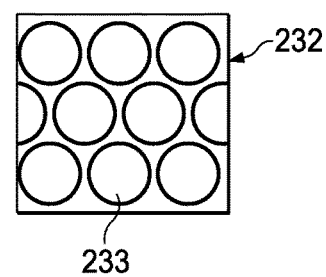
Figure 3:
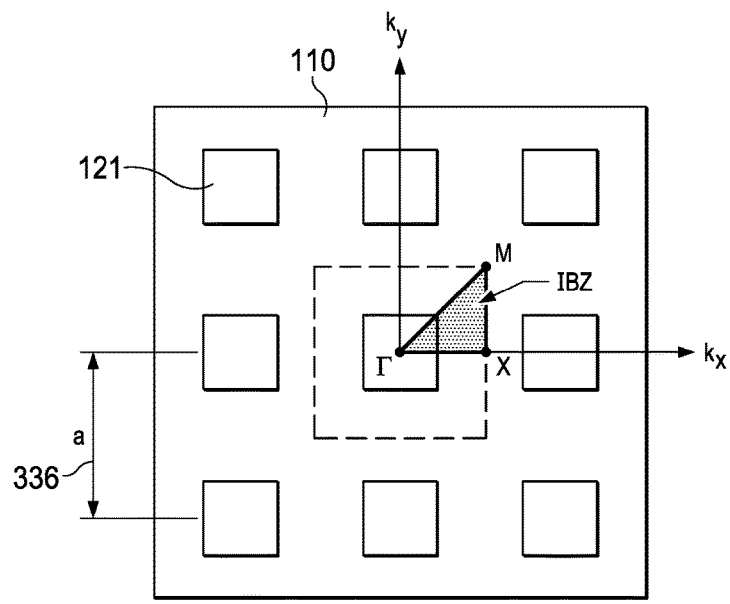
FIG. 3 is an example of another photonic bandgap structure having a square lattice.

FIG. 2A is a frequency dispersion plot illustrating a band gap in a photonic bandgap structure having a hexagonal lattice. FIG. 2B illustrates a single cell 230 of the hexagonal matrix and illustrates Brillouin zone 231 for the hexagonal cell. FIG. 2C illustrates a larger portion of a hexagonal photonic crystal 232 formed by a 3D matrix of nodes as indicated at 233. FIG. 3 is an example of another photonic bandgap structure having a square lattice.

The x-axis of FIG. 2A represents the periphery of Brillouin zone 231 of photonic crystal 232 as defined by points Γ, M, and K. The y-axis represents the angular frequency of acoustic energy propagating in photonic crystal 232 in units of ωa/2πC. The various plot lines represent propagation paths through Brillouin zone 231. Region 235 represents a photonic band gap in which the propagation of waves falling within the defined band of frequencies is blocked by interference produced by the crystal lattice.

The width and the frequency range covered by a photonic bandgap depends on the periodic spacing of the nodes 233, which may be represented by lattice constant "a" as indicated at 336 in FIG. 3, and the relative difference between the dielectric constant of the lattice material and the dielectric constant of the nodes. For example, the frequency range covered by photonic bandgap 235 may be shifted to a higher frequency range for larger relative differences between the dielectric constant of the lattice and the dielectric constant of the nodes, while the photonic bandgap 235 may be shifted to a lower frequency range for smaller relative differences between the dielectric constant of the lattice and the dielectric constant of the nodes.

Figure 4:
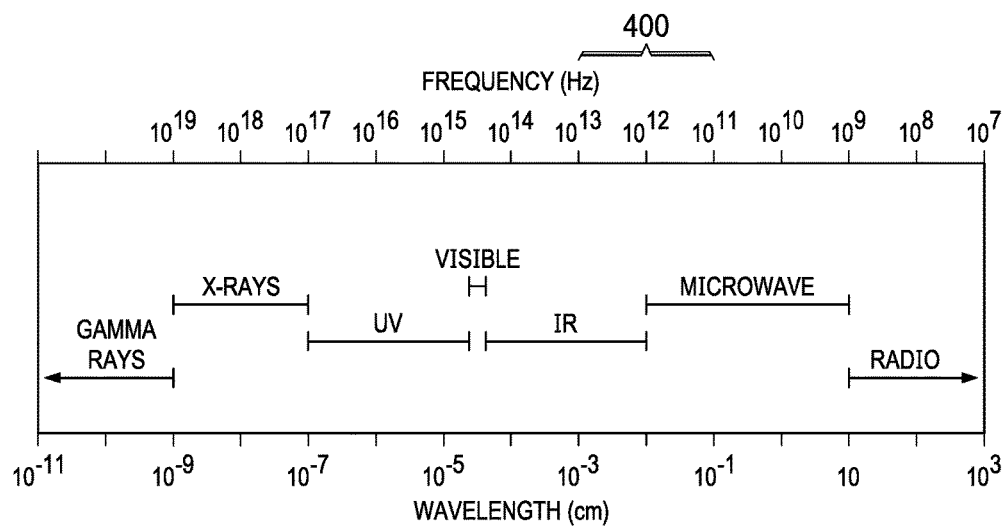
FIG. 4 is a plot illustrating a portion of the electromagnetic frequency spectrum vs. wavelength.

FIG. 4 is a plot illustrating a portion of the electromagnetic frequency spectrum vs. wavelength for an example dielectric solid material. The velocity (v) of an electromagnetic wave in a vacuum is approximately equal to the speed of light (c) in a vacuum, which is approximately $3 \times 10^8$ m/s. The velocity of an electromagnetic wave through a solid material is defined by expression (1), where $\varepsilon_r$ is the relative permittivity of the solid material, which may also be referred to as the "dielectric constant" of the material $$v = c/\sqrt{\varepsilon r} \quad (1)$$

The photonic wavelength (λ) may be determined using expression (2), where the velocity (v) in dielectric materials is typically on the order of 1-2.5×10$^8$ m/s for dielectric constant values in the range of approximately 1-10, and f is the frequency of the photon.

$$\text{lambda}(\lambda) = v/f \qquad (2)$$

For electromagnetic signals in the GHz to low THz frequency range, for example, the corresponding wavelengths in encapsulant material 120 may be in the range of several microns to several hundred microns, as indicated at 400. The opening of wide photonic band gaps requires two main conditions. The first one is to have a large physical contrast, such as density and speed of propagation of the wave movements, between the nodes and the lattice. The second condition is to present a sufficient filling factor of the nodes in the lattice unit cell. The forbidden band gap occurs in a frequency domain given by the ratio of an effective propagation velocity in the composite material to the value of the lattice parameter of the periodic array of nodes. Referring to FIG. 3, as a rule of thumb the lattice dimension 336 may be selected to be about one half of the wavelength of the center of the target photonic bandgap.

While the effect of dielectric constant (εr) is described above, other intrinsic properties of a material may be evaluated during the design of a PBG structure, such as permeability, conductivity, etc.

Figure 5:
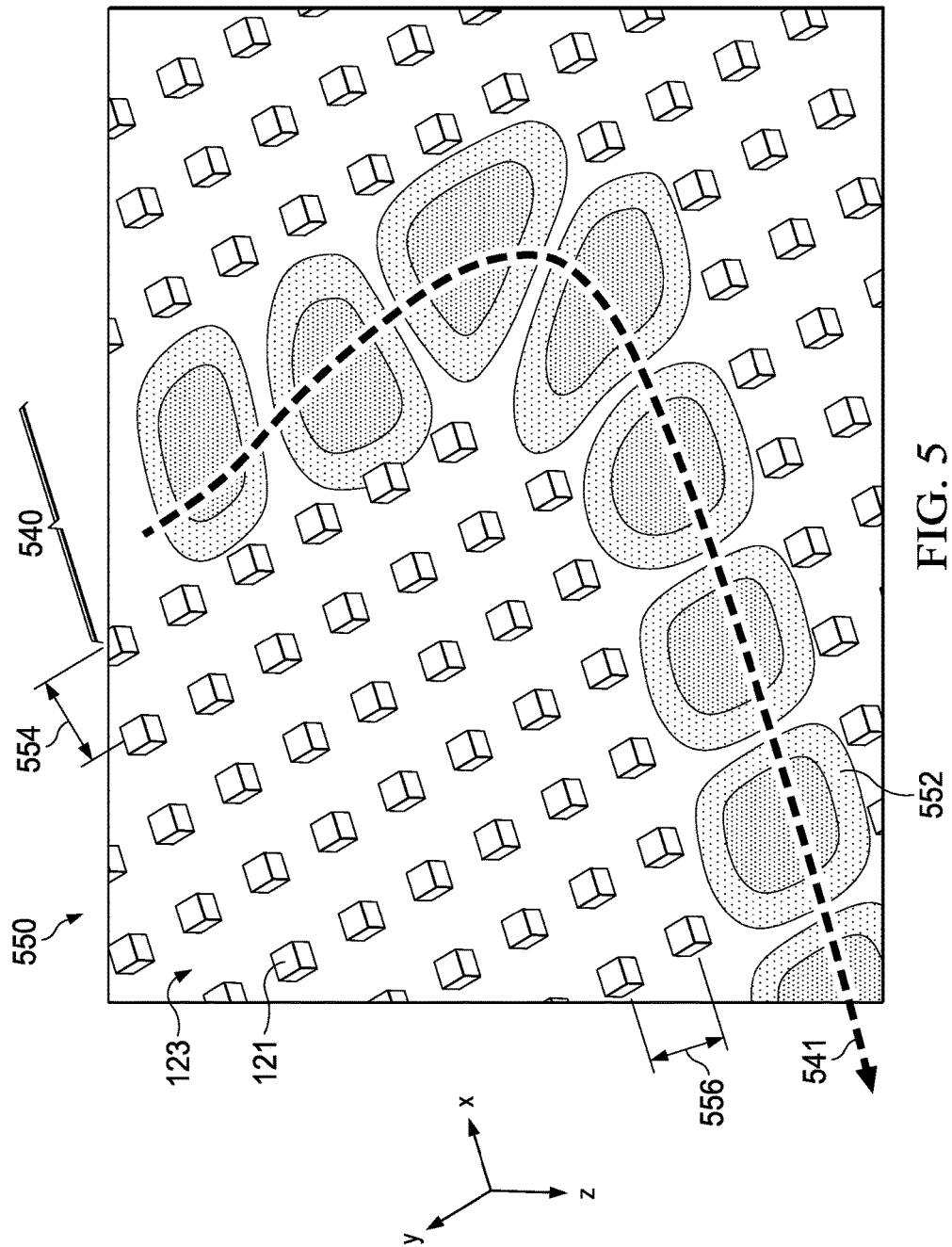
FIG. 5 illustrates a simulation of an example photonic waveguide formed by a photonic bandgap structure.

FIG. 5 illustrates a simulation of an example photonic waveguide 540 formed by an example photonic bandgap structure 550. This example illustrates a photonic waveguide that may be similar to photonic waveguide 140 in IC 100, referring back to FIG. 1. As described above, a photonic bandgap structure may be formed within encapsulation material 123 by inserting a matrix of nodes 121 with a periodic spacing. In this example, the x-axis node spacing 554 is approximately equal to the y-axis node spacing 556. The z-axis node spacing (not shown) is also approximately the same as node spacing 554, 556 in this example.

The node spacing 554-556 in this example may be selected to be approximately one half the wavelength of a selected frequency of electromagnetic radiation represented by photons 552 that should be guided by bandgap structure 550. In this manner, electromagnetic energy in the form of photons 552 that falls within the bandgap frequency range of PBG structure 550 may be guided through photonic waveguide 540 is illustrated by signal vector 541.

Figure 6:
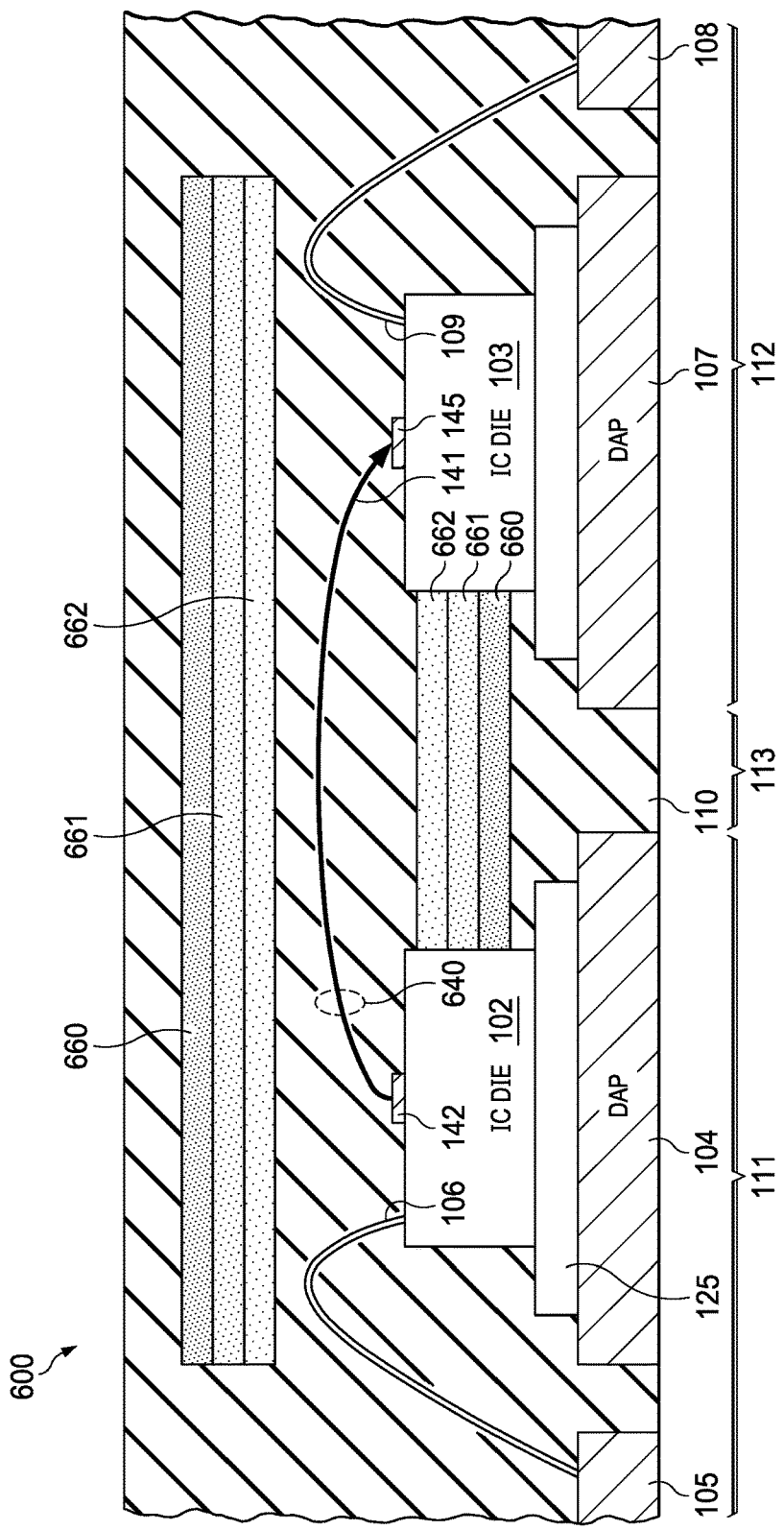
FIG. 6 is a cross section of an example encapsulated package that includes another example of a photonic waveguide formed by a multilayer photonic bandgap structure.

FIG. 6 is a cross sectional view of an example encapsulated package 600 that includes several layers of bandgap material, 660, 661, 662. In this example, three layers are illustrated, but in other embodiments additional layers may be included. Each layer 660-662 may be designed to have a different bandgap frequency range so that the combination of layers may provide a photonic waveguide 640 that may guide a larger range of frequencies than a single layer PBG structure.

While only a top portion and a bottom portion of multiple layers 660-662 are shown in FIG. 6, it is to be understood that layers 660-662 may surround and enclose photonic waveguide region 640 to guide photonic signal 141 from IC 102 to IC 103.

FIG. 7 is a top view of an example QFN leadframe 700 that may be used to support IC 102, 103 in FIG. 1, for example. Other types of packages may use a leadframe strip that has a different known or later developed configuration. Lead frame strip 700 may include one or more arrays of individual lead frames. Lead frame strip 700 is typically fabricated from a copper sheet that is etched or stamped to form a pattern of die attach pads and contacts. Lead frame strip 700 may be plated with tin or another metal that will prevent oxidation of the copper and provide a lower contact surface that is easy to solder. An IC die may be attached to each individual lead frame.

Each individual leadframe may include a pair of die attach pads, such as die attach pads 104, 107 that are separated by a distance to provide voltage isolation. Each individual lead frame also includes a set of contacts that surround the die attach pads, such as contacts 105, 108. A sacrificial strip of metal connects all of the contacts together and provides mechanical support until a sawing process removes it. An IC die, also referred to as a "chip," may be attached to each die attach pad during a packaging process, such as IC die 102, 107. Wire bonding may then be performed to connect bond pads on each IC chip to respective contacts on the lead frame. The entire lead frame strip 700 may then be covered with a layer of mold compound using an additive process as described in more detail below to encapsulate the ICs. Lead frame strip 700 may then be singulated into individual packaged ICs by cutting along cut lines 728, 729.

Figure 8C:
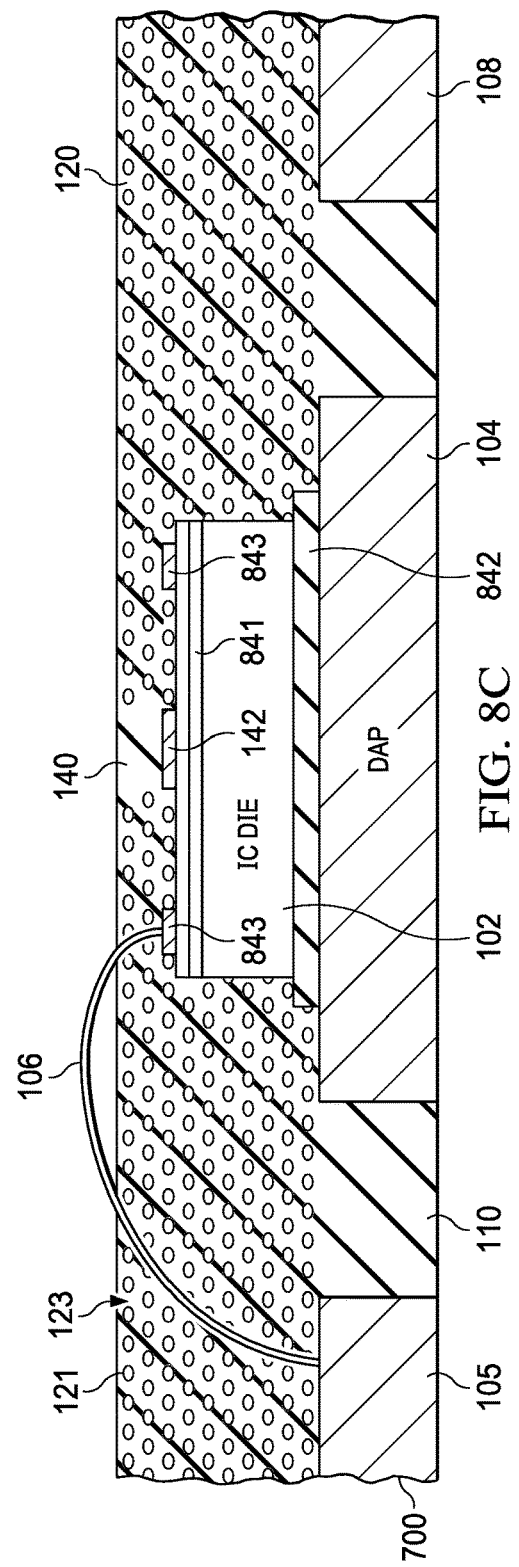

FIGS. 8A-8C are cross sectional views illustrating fabrication of the example encapsulated package 100 of FIG. 1. IC die 102 may be attached by die attach layer 842 to a die attach pad 104 of a leadframe that may be part of a leadframe strip similar to leadframe strip 700 shown in FIG. 7 that includes a set of contacts 105. IC die 102 may be fabricated using known or later developed semiconductor processing techniques. IC die 102 may include an epitaxial (epi) layer 841 on the top surface in which are formed various semiconductor transistor devices and interconnects. One or more conductive layers may be formed on the epi layer and patterned into interconnect traces and bond pads 843. A set of bond wires 106 may be attached to contacts 105 and bond pads 843 located on the surface of IC die 102 using known or later developed electrical connection techniques. While not shown in FIG. 8A, IC die 103 may be similarly constructed and attached to DAP 108. In this example, IC package 100 is a dual-flat no-leads (DFN) package; however, in other embodiments various known or later developed packaging configurations, such as MLF, SON, flip chip, dual inline packages (DIP), etc, may be fabricated using the techniques disclosed herein to form an encapsulated package with a photonic waveguide formed within the encapsulant material.

FIG. 8B is a cross sectional view illustrating partial formation of encapsulation material 110. Additive manufacturing processes are now being used in a number of areas. The International Association for Testing Materials (ASTM) has now promulgated ASTM F7292-12a "Standard Terminology for Additive Manufacturing Technologies" 2012 which is incorporated by reference herein. Currently, there are seven families of additive manufacturing processes according to the ASTM F2792 standard, including: vat photopolymerization, powder bed fusion, binder jetting, material jetting, sheet lamination, material extrusion, directed energy deposition. Hybrid processes may combine one or more of these seven basic processes with other manufacturing processes for additional processing flexibility. Recent process advances allow additive manufacturing of 3D structures that have feature resolution of less than 100 nm, such as direct laser lithography, multi-photon lithograph, two-photon polymerization, etc.

In this example, a vat photopolymerization process may be used in which leadframe strip and the ICs attached to it, such as IC die 102, are lowered into a vat of liquid photopolymer resin. A light source, such as a laser or projector, may then expose selected regions of the liquid photopolymer resin to initiate polymerization that converts exposed areas of the liquid resin to a solid. In this manner, layers of encapsulant material 110 may be formed in selected shapes. For example, encapsulant material that forms lattice 123 may be the same or different as the solid encapsulant material 110. Nodes 121 may be formed with any selected lattice spacing.

FIG. 8C is a cross sectional view illustrating further partial formation of encapsulation material 110 around IC die 102. Additional layers of liquid encapsulation material 110 have been exposed and converted to a solid. Selective exposure of the liquid resin allows lattice 123 to be formed with nodes 121, as described with regard to FIG. 1. A small portion of photonic waveguide 140 is illustrated in FIG. 8C. Photonic waveguide 140 is formed in this example by omitting nodes 123 from the encapsulation material in the region that forms photonic waveguide 140. Photonic waveguide 140 is positioned to couple to transmitter launch structure 142.

The leadframe strip may be submerged in different vats at different times in order to allow different materials to form the nodes 121 within lattice 123.

Additional layers of resin may be exposed and hardened to form the final outside encapsulation layer illustrated in FIG. 1. The leadframe strip may then be sawed or otherwise separated into individual encapsulated IC packages.

In another embodiment, other additive manufacturing processes may be used to form encapsulation material 110. For example, a powdered bed diffusion process may be used in which a powdered material is selectively consolidated by melting it together using a heat source such as a laser or electron beam.

In another embodiment, a material jetting process may be used in which droplets of material are deposited layer by layer to produce a photonic waveguide within an encapsulation structure as described herein. However, bond wires 106 may require extra care to avoid disrupting the droplet streams.

In another embodiment, bond wires are not initially bonded to contacts 105 and bond pads 843. In this example, a material jetting process may be used in which droplets of material are deposited layer by layer to produce a photonic bandgap structure as described herein. As part of the material jetting process, a conductive material may be deposited to form the bond wires between contacts 105 and bond pads 843. In some embodiments, a sintering process may be done by heating the encapsulated leadframe 700 assembly to further solidify the bond wires. The leadframe strip 700 may then be sawed or otherwise separated into individual encapsulated IC packages.

In another embodiment, IC die 102 is not initially attached to die attach pad 104 of a leadframe that may be part of a leadframe strip similar to leadframe strip 700 shown in FIG. 7. In this example, a vat photopolymerization process may be used in which the leadframe strip is lowered into a vat of liquid photopolymer resin. A light source, such as a laser or projector, may then expose selected regions of the liquid photopolymer resin to initiate polymerization that converts exposed areas of the liquid resin to a solid. In this manner, layers of encapsulant material 110 may be formed in selected shapes. In this manner, a photonic bandgap structure 126 as shown in FIG. 1 may be fabricated on top of die attach pad 104 to isolate a later attached IC die from die attach pad 104. Spaces may be left above each contact 105 for later attachment of bond wires. A set of bond wires 106 may be attached to contacts 105 and bond pads 643 located on the surface of IC die 106 using known or later developed wire bonding techniques. Additional layers of resin may be exposed and hardened to form an additional photonic bandgap structure as described with regard to FIGS. 8A-8C, for example. The leadframe strip may then be sawed or otherwise separated into individual encapsulated IC packages.

In another embodiment, the photonic bandgap structure may be fabricated using a lattice material that includes filler particles diffused throughout the lattice material in place of the explicitly formed nodes as described above, such as nodes 121. In this case, the filler particles are selected to have a size and material composition that will influence the characteristics of electromagnetic wave propagation, as described above. The filler material may be a polymer or other material that has different intrinsic material properties from the lattice material, in a similar manner as the difference between nodes 121 and lattice material 123. In some embodiments, the filler material may have a higher dielectric constant than the lattice material, while in other embodiments the filler material may have a lower dielectric constant than the lattice material, for example.

In another embodiment, multiple photonic bandgaps may be formed by using two or more types of fillers. For example, a portion of the filler material may have a high dielectric constant, while another portion of the filler material may have a low dielectric constant. In some embodiments, different size filler particle may be used in different regions or in a same region to form multiple bandgaps. In some embodiments, a different number of filler particles per unit volume may be used in different regions to form different bandgaps.

In this case, the filler dispersion may not be perfectly crystalline, but there will be a statistical mean separation of the filler particle that may lend itself to a bandgap based on the statistical mean separation distance of the filler particles.

An additive manufacturing process may be used to encapsulate an IC die using two or more different polymers, such as one with filler particles and one without filler particles to form the PBG structures as described herein or other configurations of PBG structures.

Alternatively, a selective molding process may be used in which one area of the encapsulation is molded with first polymer having either no filler particles or a first configuration of filler particles (size, material, number of particles per unit volume, etc.) and other areas are molded with a polymer having a different filler particle configuration to form a PBG structure as described herein or other configurations of PBG structures.

Figure 9:
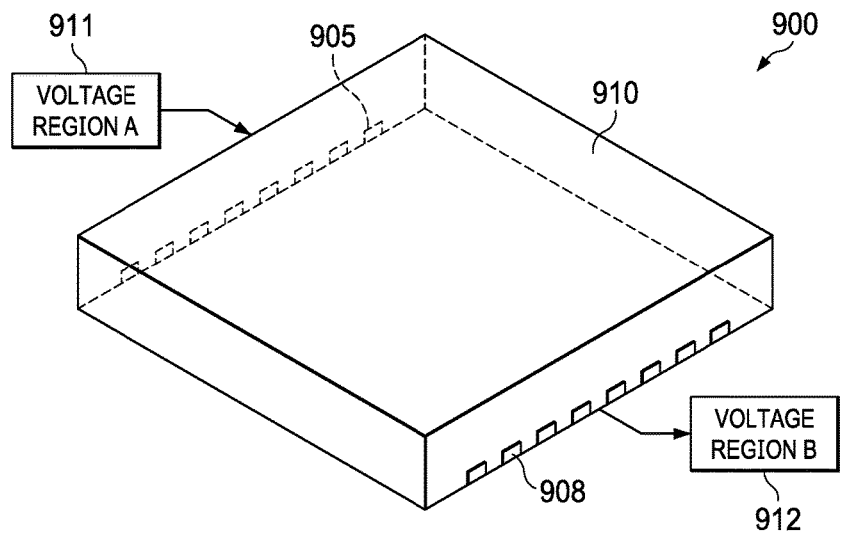
FIG. 9 illustrates a top view of an example encapsulated package containing a photonic structure.

FIG. 9 is top view of an example encapsulated package 900 that includes a photonic waveguide provided by a photonic bandgap structure within the encapsulant material as described herein. IC 900 is an illustration of a dual-flat no-leads (DFN) IC package that was encapsulated using additive manufacturing process to form photonic waveguide structures within the encapsulation material as described herein. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of PCBs without through-holes. Flat no-lead is a near chip scale plastic encapsulation package made with a planar copper lead frame substrate. Perimeter lands on the package bottom provide electrical connections to the PCB. The QFN package is similar to the quad-flat package, and a ball grid array.

DFN package 900 includes a set of contacts 905 arrayed on one side of the package on the bottom side and a set if contacts 908 arrayed on an opposite side. The entire assembly is encapsulated in an encapsulation material 910 using a manufacturing process as described herein to provide galvanic path isolation using a photonic waveguide photonic bandgap structure. While a DFN is illustrated in FIG. 9, other embodiments may use other types of integrated circuit packages.

As described above in more detail, DFN package 900 may provide galvanic path isolation between a system operating in a voltage region 911 and another system operation in a different voltage region 912.

Figure 10:
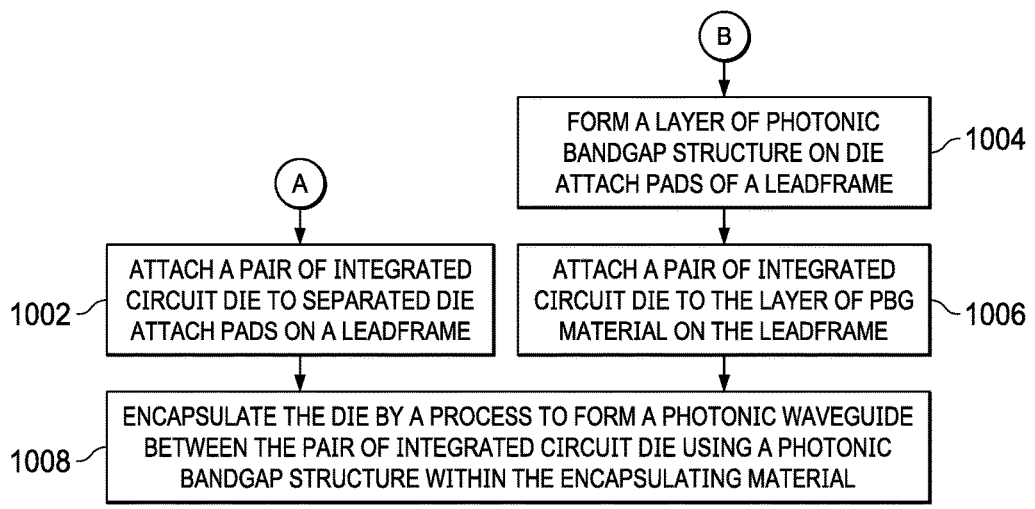
FIG. 10 is a flow chart illustrating an example process for formation of a photonic waveguide from an photonic bandgap structure within an encapsulated package.

FIG. 10 is a flow diagram illustrating fabrication of the example encapsulated package of FIG. 1. In one embodiment, as described above in more detail, a pair of IC die may be attached to separate die attach pads of a leadframe that includes a set of contacts as indicated at box 1002. The IC die may be fabricated using known or later developed semiconductor processing techniques. The IC die may include an epitaxial (epi) layer on the top surface in which are formed various semiconductor transistor devices and interconnects. One or more conductive layers may be formed on the epi layer and patterned into interconnect traces and bond pads. A set of bond wires may be attached to the contacts and bond pads located on the surface of the IC die using known or later developed wire bonding techniques.

In another embodiment, a layer of material that includes a photonic bandgap structure may be first formed on the die attach pads of the leadframe, as indicated at 1004. The encapsulation material may be formed into a lattice with periodically spaced nodes that are filled with a different type of material to form a photonic bandgap structure. As described above in more detail, an additive manufacturing process may be used to create the lattice and fill the nodes in the lattice.

A pair of IC die may then be attached to the layer of PBG material, as indicated at 1006.

The pair of IC die may then be completely encapsulated by an additive process to form a photonic waveguide between the pair of IC die within the encapsulation material as indicated at 1008. A first portion of the encapsulation material may be solid and a second portion of the encapsulation material may include nodes filled with a second material to form a photonic bandgap structure. As described above in more detail, an additive manufacturing process may be used to create a lattice and fill the periodically spaced nodes in the lattice with a different type of material, or with several different types of material in different locations. A photonic waveguide may be formed during the encapsulation process by simply omitting nodes from the region that forms the photonic waveguide.

In another embodiment, the encapsulation process indicated at box 1008 may be done using a selective molding process in which one area of the encapsulation is molded with first polymer having either no filler particles or a first configuration of filler particles (size, material, number of particles per unit volume, etc.) and other areas are molded with a polymer having a different filler particle configuration diffused within the polymer to form a PBG structure as described herein or other configurations of PBG structures.

As discussed above in more detail, various types of IC packages may be formed in this manner. For example, a dual-flat no-leads (DFN) package is illustrated in FIG. 1. However, in other embodiments various known or later developed packaging configurations, such as DFN, MLF, SON, flip-chips, dual inline packages (DIP), etc, may be fabricated using the techniques disclosed herein to form an encapsulated package with galvanic path isolation provided by a photonic waveguide included with the encapsulant material.

Figure 11:
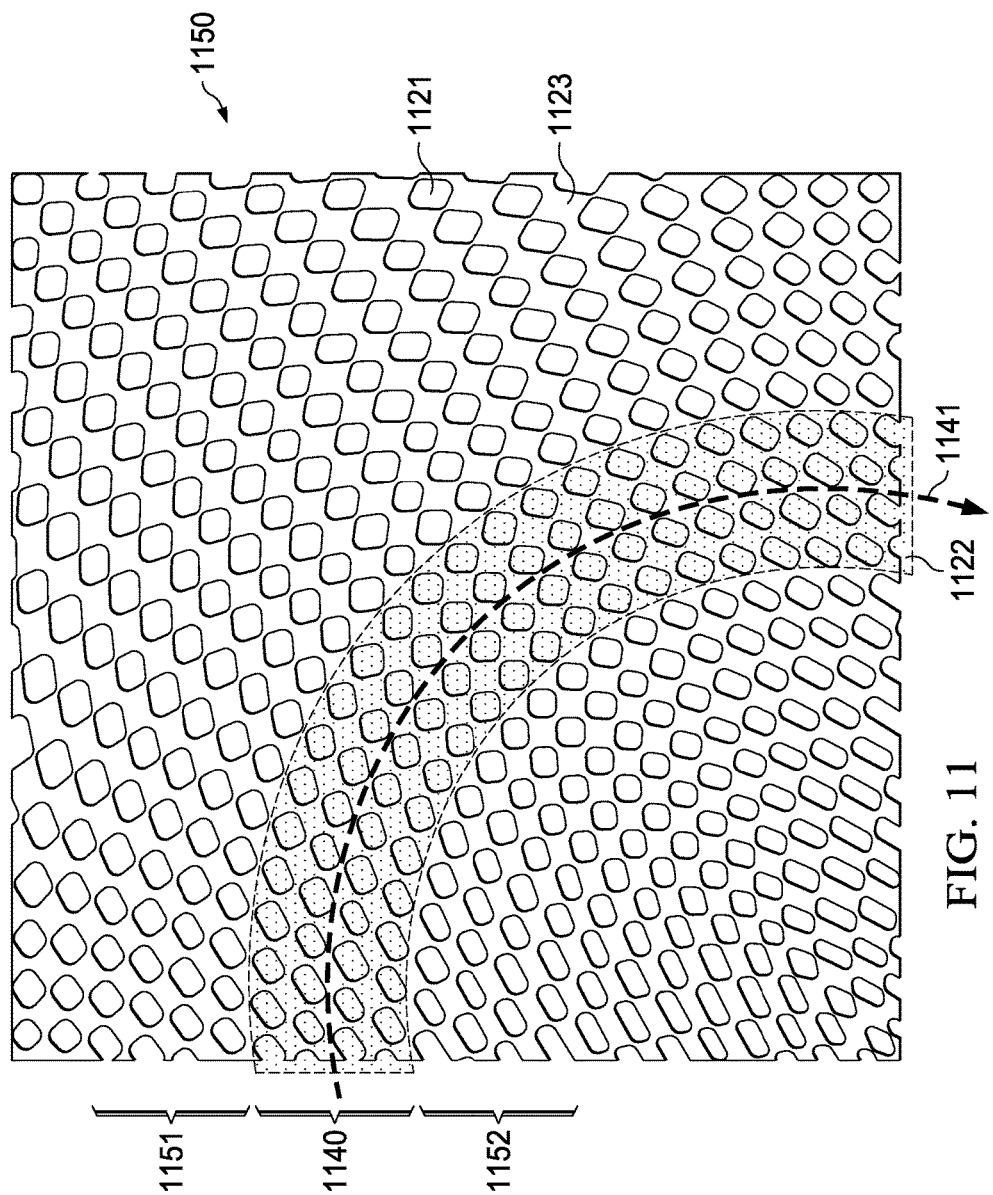
FIG. 11 illustrates a simulation of another example photonic waveguide.

FIG. 11 illustrates a simulation of another example photonic waveguide 1140 formed within a photonic structure 1150. Photonic structure 1150 is similar to photonic structure 550 as illustrated in FIG. 5 in that an array of nodes 1121 within a lattice material 1123 form an approximately periodic structure. However, in this example photonic waveguide region 1140 may be populated with nodes 1122. Nodes 1122 may be the same as nodes 1121, or they may be different in intrinsic properties, shape, spacing, etc.

In this example, a continuous lattice may be provided that steers the photon energy 1141 by curving the lattice in the direction of travel. The nodes 1122 in the "pathway" do not improve propagation but do steer it. In this manner, the space in the path of the photons may be warped as opposed to creating a hallway for them to bounce down. This may be analogous to a boat on a river; the river (curved lattice) is already flowing in a certain direction and pulls the boat (photon) in that direction.

An additive process as described above in more detail with reference to FIGS. 8A-8C may be used to place the array of nodes to form the curved lattice during encapsulation of an encapsulated package.

Nodes 1122 within photonic waveguide region 1140 may configured such that they do not provide a bandgap to the frequency of photonic signal 1141 so that photonic signal 1141 may propagate through photonic waveguide region 1140.

Nodes 1121 may also be configured such that they do not provide a bandgap to the frequency of photonic signal 1141. However, the photonic energy of photonic signal 1141 may be directed along photonic waveguide region by curving the lattice of photonic structure 1150 to maintain an approximately smooth wall of nodes 1121 along the edge of phonic waveguide region 1140. Similarly, nodes 1122 are arranged in a curved manner to provide a pathway for phonons 1141. Photonic structure 1150 may be referred to as a "resonant structure" that acts as a bandpass structure as opposed to a bandgap structure.

Figure 12:
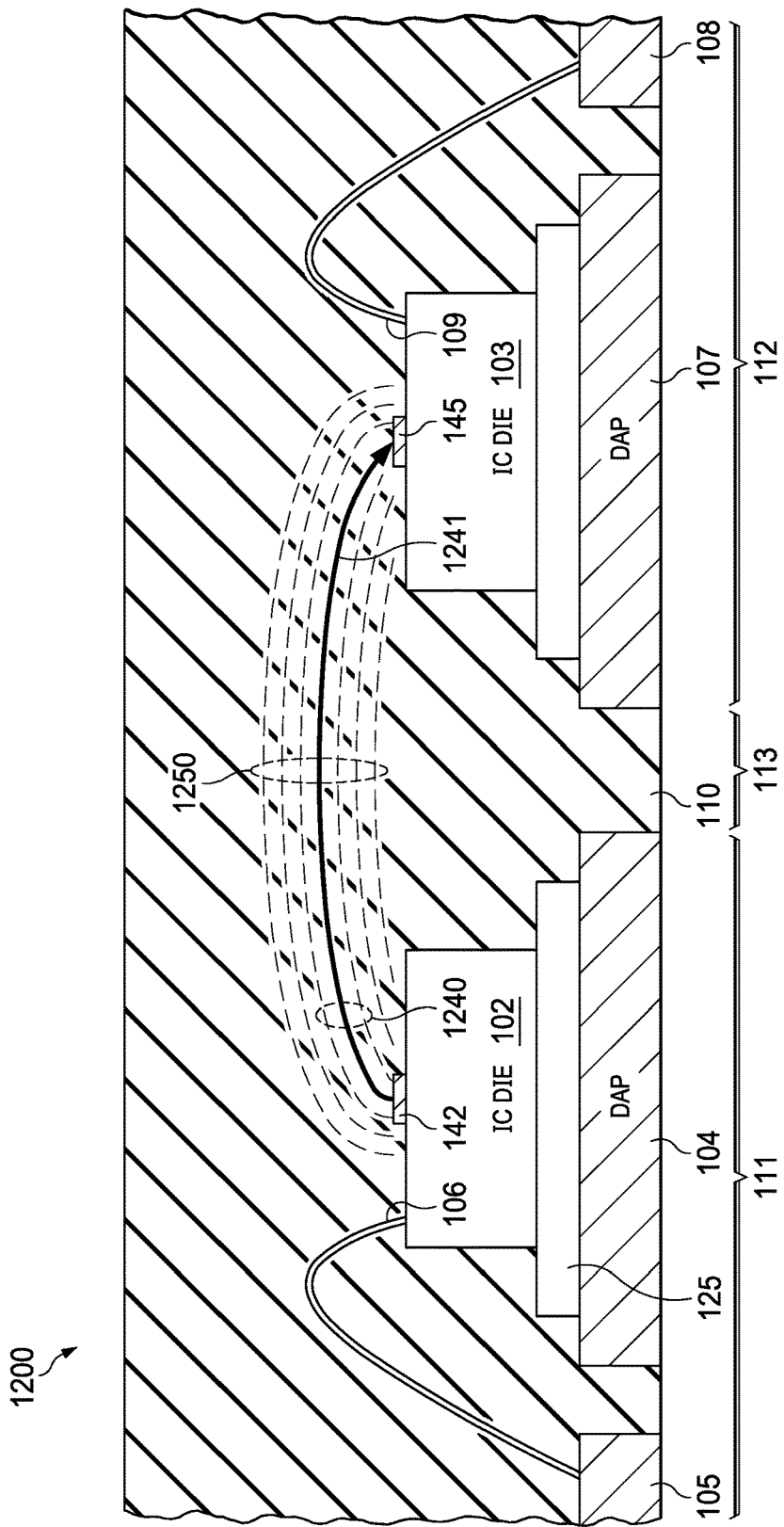
FIG. 12 is a cross sectional view of another example encapsulated package that includes a photonic waveguide formed by a resonant structure.

FIG. 12 is a cross sectional view of another example encapsulated package 1200 that includes a photonic waveguide 1240 formed by a resonant structure 1250. In this example, resonant structure 1250 is implemented in a similar manner as resonant structure 1150 as shown in FIG. 11 and relies on warping the lattice structure to guide phonon stream 1241 from a transmitter on IC die 102 to a receiver on IC die 103.

As described above in more detail, galvanic path isolation between IC die 102 and IC die 103 is provided by the spacing 113 between the two IC die and the dielectric strength of encapsulant material 110 and resonant structure 1250.

OTHER EMBODIMENTS

While the disclosure has been described with reference to illustrative embodiments, this description is not intended to be construed in a limiting sense. Various other embodiments of the disclosure will be apparent to persons skilled in the art upon reference to this description. For example, in some embodiments, the lattice material may have a relatively low dielectric constant value and the node material may have relatively high dielectric constant value. In other embodiments, the lattice material may have relatively high dielectric constant value and the node material may have a relatively low dielectric constant value. In some embodiments, the node material may be air, another gas, or a vacuum, for example.

While PBG structures using materials with different permittivities were described herein, other embodiments may use materials having differences in other intrinsic properties, such as permeability, conductivity, magnetic, etc.

In some embodiments, a portion of the nodes may be formed with one kind of material, while another portion of the nodes may be formed with a different material. Several different types of material may be used to form different sets of nodes within the photonic bandgap structure to thereby tailor the performance of the photonic bandgap structure.

In some embodiments, a portion of the nodes may be formed with one lattice constant, while another portion of the nodes may be formed with a different lattice constant. Several different lattice constants may be used to form different sets of nodes within the photonic bandgap structure to thereby tailor the performance of the photonic bandgap structure The nodes may be fabricated using various materials, such as: various polymers such as polyurethane, polyacrylates, etc., ceramic materials, metals, gases such as natural air, nitrogen etc. In some cases, a vacuum may be left and therefore no material would be used for some lattice nodes.

In some embodiments, the PBG structure may be symmetric in 3D, while in other embodiments the PBG structure may be asymmetric with different lattice spacing in different directions.

In some embodiments, the PBG structure may have a bandgap that is effective in all directions, while in other embodiments the PBG structure may have a bandgap in one direction but not in another direction, for example.

In another embodiment, an IC die may be partially or completely surrounded by a photonic bandgap structure in the form of an enclosure that surrounds the IC, such as a box shaped or spherical shaped enclosure that is formed within the encapsulation material by selective placement of nodes within the encapsulation material.

Another embodiment may include packages that are entirely encased in mold compound, such as a dual inline package (DIP).

In another embodiment, the PBG structure may be made with ferroelectric or magnetic material. In this case, a field bias may be applied to the PBG structure using coils or plates located on the IC die or adjacent to the IC die to tune the bandgap. The amount of bias may be controlled by control circuitry located on the IC die, or by control circuitry that is external to the IC die.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A device, comprising:
   a first integrated circuit (IC) die having an electromagnetic transmitter circuit, the electromagnetic transmitter circuit having an output configured to emit an electromagnetic signal;
   a second IC die having an electromagnetic receiver circuit, the electromagnetic receiver circuit having an input configured to receive the electromagnetic signal, the second IC die spaced apart from the first IC die;
   a leadframe having first and second die attach pads, the first die attach pad separated from the second die attach pad;
   a photonic structure including a photonic waveguide coupled between the output of the electromagnetic transmitter circuit and the input of the electromagnetic receiver circuit, a portion of the photonic structure being located between the first IC die and the first die attach pad; and
   an encapsulation material encapsulating the first IC die, the second IC die and the photonic waveguide.

2. The device of claim 1, wherein the photonic waveguide includes a photonic bandgap (PBG) structure.

3. The device of claim 2, wherein the PBG structure has a bandgap that includes a frequency of the electromagnetic signal.

4. The device of claim 2, wherein the PBG structure is a multilayer PBG structure, in which layers of the multilayer PBG structure have respective photonic bandgaps with different frequency ranges.

5. The device of claim 4, wherein the respective photonic bandgap of at least one of the layers of the multilayer PBG structure includes a frequency of the electromagnetic signal.

6. The device of claim 4, wherein a first layer of the multilayer PBG structure includes a first matrix of periodically spaced nodes having a first intrinsic property within the encapsulation material, and a second layer of the multilayer PBG structure includes a second matrix of periodically spaced nodes having a second intrinsic property within the encapsulation material, and the encapsulation material has a third intrinsic property, and the first intrinsic property is different from the second intrinsic property and different from the third intrinsic property.

7. The device of claim 1, wherein the photonic structure is a photonic resonant structure having a pass band that includes a frequency of the electromagnetic signal.

8. The device of claim 1, wherein a frequency of the electromagnetic signal is an optical frequency.

9. The device of claim 1, wherein a frequency of the electromagnetic signal is a radio frequency.

10. The device of claim 1, wherein the second IC die is spaced apart from the first IC die by a separation distance that exceeds a voltage breakdown distance.

11. The device of claim 1, wherein the photonic structure includes a matrix of periodically spaced nodes within the encapsulation material, the encapsulation material has a first intrinsic property, and the nodes have a second intrinsic property that is different from the first intrinsic property.

12. The device of claim 11, wherein the nodes have a permittivity that is greater than a permittivity of the encapsulation material.

13. The device of claim 1, wherein the photonic structure includes a diffusion of particles within the encapsulation material, the encapsulation material has a first intrinsic property, and the nodes have a second intrinsic property that is different from the first intrinsic property.

14. The device of claim 1, wherein the photonic waveguide has a rectangular cross section in which a long side of the cross section is twice as long as a short side of the cross section.

15. A method, comprising:
 forming a photonic structure including a photonic waveguide;
 through a portion of the photonic structure, attaching a first integrated circuit (IC) die having an electromagnetic transmitter to a first die attach pad of a leadframe, the portion of the photonic structure being located between the first IC die and the first die attach pad;
 attaching a second IC die having an electromagnetic receiver to a second die attach pad of the leadframe, in which the first die attach pad is separated from the second die attach pad, the first IC die is spaced apart from the second IC die, and the photonic waveguide is coupled between an output of the electromagnetic transmitter and an input of the electromagnetic receiver; and
 with an encapsulation material, encapsulating the first IC die, the second IC die and the photonic waveguide.

16. The method of Claim 15, wherein forming the photonic structure comprises forming a matrix of periodically spaced nodes within the encapsulating material, in which the encapsulation material has a first intrinsic property, and the nodes have a second intrinsic property that is different from the first intrinsic property.

17. The method of Claim 15, wherein forming the photonic structure comprises:
 forming a first matrix of periodically spaced nodes within the encapsulating material, the first matrix having a first lattice constant; and
 forming a second matrix of periodically spaced nodes within the encapsulating material, the second matrix having a second lattice constant.

18. The method of Claim 15, wherein forming the photonic structure comprises diffusing particles within the encapsulating material, in which the encapsulation material has a first intrinsic property, and the particles have a second intrinsic property that is different from the first intrinsic property.

* * * * *